(12) United States Patent
Schurmann et al.

(10) Patent No.: US 10,666,279 B1
(45) Date of Patent: May 26, 2020

(54) POWER SUPPLY TELEMETRY SELF-CALIBRATION

(71) Applicant: TEXAS INSTRUMENTS INCORPORATED, Dallas, TX (US)

(72) Inventors: Matthew John Ascher Schurmann, Manchester, NH (US); Mayank Jain, Bengaluru (IN); Wenkai Wu, East Greenwich, RI (US); Preetam Charan Anand Tadeparthy, Bangalore (IN); Kuang-Yao Cheng, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/287,711

(22) Filed: Feb. 27, 2019

(51) Int. Cl.
*H03M 1/12* (2006.01)
*H03M 1/10* (2006.01)
*H03M 1/16* (2006.01)
*H03K 19/173* (2006.01)

(52) U.S. Cl.
CPC ...... *H03M 1/1023* (2013.01); *H03K 19/1733* (2013.01); *H03M 1/1057* (2013.01); *H03M 1/162* (2013.01)

(58) Field of Classification Search
CPC .. H03M 1/1023; H03M 1/1057; H03M 1/162; H03M 1/12; H03K 19/1733

USPC ........................................................ 341/155
See application file for complete search history.

(56) References Cited

U.S. PATENT DOCUMENTS

| | | | |
|---|---|---|---|
| 6,947,854 B2* | 9/2005 | Swarztrauber | G01D 4/008 702/62 |
| 8,320,844 B2* | 11/2012 | Ibrahim | H04B 1/406 455/552.1 |
| 9,209,770 B2* | 12/2015 | Rozenblit | H03G 3/3042 |
| 9,921,629 B2* | 3/2018 | Berke | G06F 1/26 |
| 9,971,389 B2* | 5/2018 | Wu | G06F 1/28 |
| 2003/0151415 A1* | 8/2003 | Randall | G01R 35/04 324/601 |

* cited by examiner

*Primary Examiner* — Jean B Jeanglaude
(74) *Attorney, Agent, or Firm* — Mark Allen Valetti; Frank D. Cimino

(57) ABSTRACT

A circuit includes a phase control logic, an analog-to-digital converter (ADC), and digital logic. The phase control logic is configured to couple to a plurality of power phases of a multi-phase power supply. The digital logic is configured to couple to the phase control logic and the ADC, to receive an instruction to operate in a self-calibration mode of operation, receive a first message including a value associated with a calibrated load configured to couple to the plurality of power phases, perform a self-calibration sub-routine for each power phase of the plurality of power phases based at least partially on the received instruction, the received first message, and a signal received from the ADC, and receive a second message instructing the digital logic to store a result of the self-calibration in a memory of the circuit.

20 Claims, 7 Drawing Sheets

POWER SUPPLY TELEMETRY SELF-CALIBRATION

BACKGROUND

In some instances, a manufacturer of circuits performs a final test of the circuits at an end of a manufacturing process to verify operation of the circuits and, in some cases, performs trimming and/or adjustment of parameters of the circuits based on an outcome of the testing. For example, offset and/or gain settings of the circuits may be modified based on the testing. However, it may be impractical, if not impossible, for the manufacturer to separately test every circuit for the purposes of trimming the circuit, and the manufacturer may therefore rely on characterization testing. For example, the manufacturer may test a portion of a production run of circuits and, based on results obtained from the test of the portion of the production run of circuits, trim the full production run of circuits (e.g., such as using an average value obtained from the test of the portion of the production run of circuits). While this trimming may correct for systematic errors in the circuits, it does not account for assembly to assembly variation between the circuits and therefore may result in some of the circuits being trimmed properly, some trimmed sufficiently but not optimally, and some trimmed insufficiently.

SUMMARY

At least some aspects of the present disclosure provide for a circuit. In at least one example, the circuit comprises phase control logic, an analog-to-digital converter (ADC), and digital logic. The phase control logic is configured to couple to a plurality of power phases of a multi-phase power supply. The first amplifier is configured to couple at an input to a first of the plurality of power phases. The second amplifier is configured to couple at an input to a second of the plurality of power phases. The ADC is configured to couple to the first amplifier and the second amplifier. The digital logic is configured to couple to the phase control logic and the ADC, to receive an instruction to operate in a self-calibration mode of operation, receive a first message including a value associated with a calibrated load configured to couple to the plurality of power phases, perform a self-calibration sub-routine for each power phase of the plurality of power phases based at least partially on the received instruction, the received first message, and a signal received from the ADC, and receive a second message instructing the digital logic to store a result of the self-calibration in a memory of the circuit.

Other aspects of the present disclosure provide for a method. In at least one example, the method comprises receiving, at a circuit, an instruction to operate in a self-calibration mode of operation to calibrate at least some of a plurality of power phases associated with the circuit, receiving a first message including a value associated with a calibrated load configured to couple to the plurality of power phases, performing a self-calibration sub-routine for at least some power phases of the plurality of power phases based at least partially on the received instruction and the received first message, and receiving a second message including an instruction to store a result of the self-calibration in a memory structure.

Other aspects of the present disclosure provide for a system. In at least one example, the system comprises a plurality of power phases, a load coupled to each of the plurality of power phases, and a controller. In at least one example, the controller is configured to receive an instruction to operate in a self-calibration mode of operation to calibrate at least some of the plurality of power phases, receive a first message including a value associated with the load, perform a self-calibration sub-routine for at least some power phases of the plurality of power phases based at least partially on the received instruction and the received first message, and receive a second message including an instruction to store a result of the self-calibration in a memory structure.

BRIEF DESCRIPTION OF THE DRAWINGS

For a detailed description of various examples, reference will now be made to the accompanying drawings in which.

DETAILED DESCRIPTION

Figure 1:
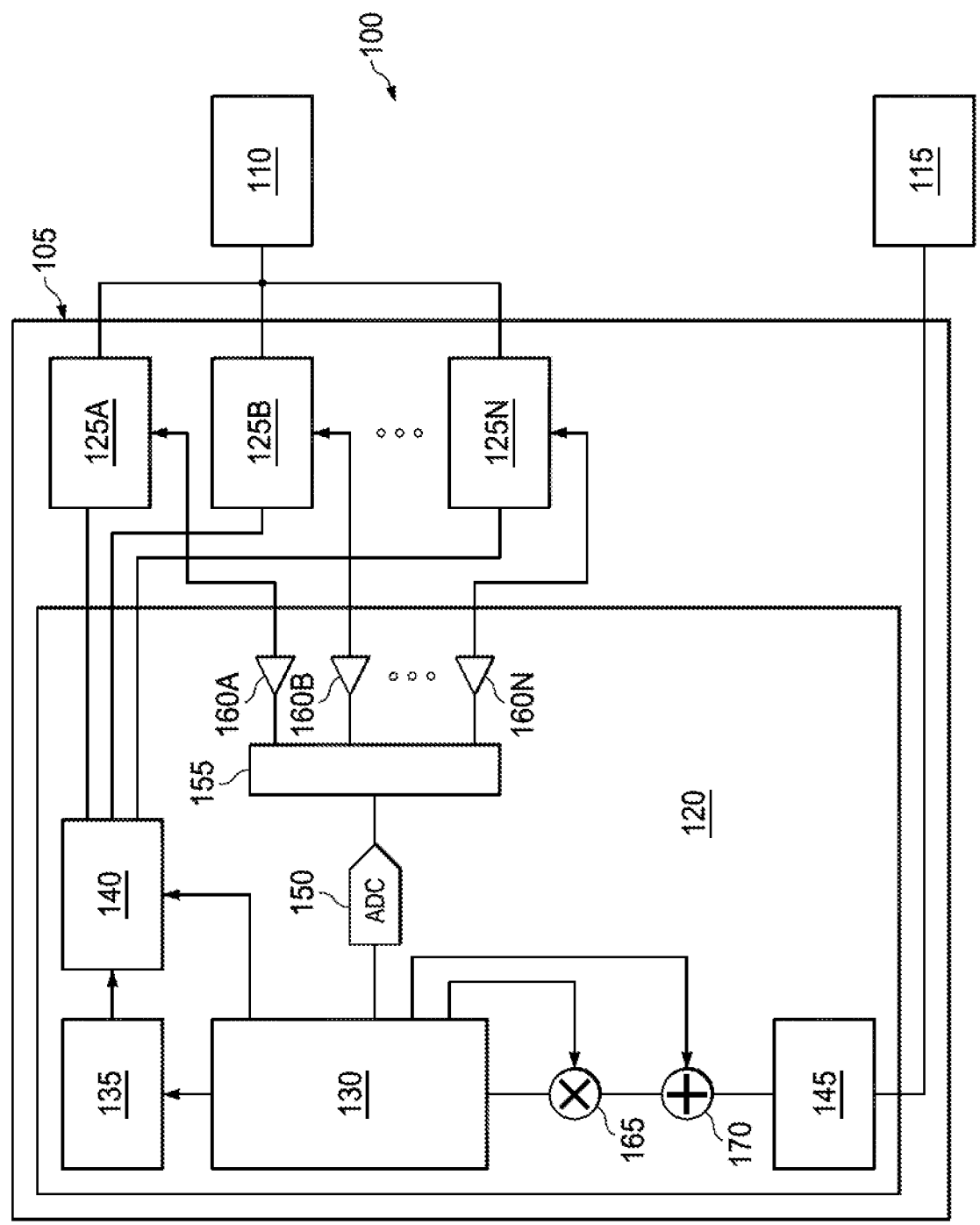
FIG. 1 shows a block diagram of an illustrative system in accordance with various examples.

As discussed above, a manufacturer of circuits may trim the circuits based on a test of a portion of a production run of the circuits to correct for systematic errors in the circuits, it does not account for assembly to assembly variation between the circuits and therefore may result in some of the circuits being trimmed properly, some trimmed sufficiently but not optimally, and some trimmed insufficiently. However, the manufacturer of the circuits is in control of trimming of only the circuits themselves. When the circuits are intended for combination by an end user (e.g., a customer of the manufacturer who purchases the circuits from the manufacturer) with other components from other manufacturers, the other components, as well as interconnects between the circuit and the other components, can add further error that the manufacturer cannot trim the circuits to compensate for because of the unknown factor inherent to these other components and interconnects. For example, when the circuit is a controller intended for use in a multi-phase (or multi-stage) power supply, the manufacturer of the controller can only trim the controller at a time of manufacturing for errors found within the controller itself. The manufacturer of the controller cannot trim the controller for errors that may result from interconnects to power stages (where each power stage is a phase of the multi-phase power supply) of the power supply or errors in the power stages themselves. The purchaser of the controller and power stages who assembles the controller and power stages together on a circuit board with interconnects faces the same challenges that make it impractical, if not impossible, to separately test and trim every power supply that is manufactured. As a result, even with trimming performed based on a random test of a portion of a production run of devices, random errors will still occur, leading to less than optimal performance.

In at least some examples, the controller of the power supply is configured to couple to a processing device (referred to herein for simplicity as a central processing unit (CPU), but that could be implemented as any suitable processing device) that polls the controller for telemetry data related to operation and performance of the power supply. For example, the CPU polls the controller to determine operational characteristics of the power supply, such as a temperature of the power supply, temperature of one or more power stages of the power supply, output current of the power supply, output voltage of the power supply, etc. In some examples, the CPU modifies operation of a load coupled to the power supply in response to the telemetry data obtained from the controller. In this regard, inaccurate telemetry data can impact performance of a load coupled to the power supply, in some circumstances negatively. For example, when the load is a server computer, or components of the server computer (such as the CPU itself, a field-programmable gate array (FPGA), an application specific integrated circuit (ASIC), etc.), the CPU may modify (such as reduce) an operating frequency of the server computer and/or CPU in response to the controller reporting a temperature, current output, voltage output, or other characteristic of one or more of the power stages that the CPU determines to exceed a threshold. If the telemetry data reported by the controller is inaccurate, for example as a result of imprecise trimming of the controller or an inability to trim the controller for errors introduced by interconnects or the power stages, the CPU may modify the operating frequency of the server computer unnecessarily or to an incorrect value, thereby reducing efficiency and user experience of the server computer and/or, potentially, damaging one or more components of the server computer and/or one or more components of the power supply.

At least some aspects of the present disclosure provide for a power supply having a controller suitable for performing self-calibration. The self-calibration, in various examples, includes at least offset calibration. In other examples, the self-calibration further, or alternatively, includes gain calibration. In other examples, the self-calibration further, or alternatively, includes temperature compensation. Each of the calibrations of the controller can include adjustments to current values, adjustments to voltage values, or both. For example, the controller can perform current offset calibration and voltage offset calibration alternatively or collectively. Similarly, the controller can perform current gain calibration and current offset calibration alternatively or collectively. In at least some examples, at least some of the self-calibration described herein improves accuracy of telemetry data provided to a CPU coupled to the controller, thereby improving operation of the CPU and/or a device at least partially under control of the CPU. In other examples in which the controller does not communicate the telemetry data to a CPU to enable the CPU to modify operation of a load coupled to the power supply, performance of the power supply can still be optimized via the self-calibration of the controller. For example, in a system with line droop in which output voltage of the power supply reduces at a given slope related to increasing current output (e.g., to minimize overall power consumption), the self-calibration described herein can, in some examples, increase efficiency and/or performance of the power supply. In at least some examples, in such a system in which the controller does not communicate the telemetry data to a CPU to enable the CPU to modify operation of a load coupled to the power supply, the controller still communicates with a CPU (or other form of processing device) to perform the self-calibration disclosed herein. The self-calibration disclosed herein, in at least some examples, mitigates the abovementioned inaccuracies, imprecision, impracticality, and/or other difficulty in trimming a power supply, and in at least some examples improves performance of the power supply to a greater degree than available through a trimming process performed at a time of manufacture of the controller.

Turning now to FIG. 1, an illustrative system 100 is shown. In at least one example, the system 100 is representative of a server computer (e.g., such as an enterprise server that may be implemented in a data center or network back-end environment). While only certain components of the system 100 are shown, when the system 100 is representative of a server computer it is understood that the server computer could include other components that are not shown such as memory (e.g., random access memory (RAM)), input devices, output devices, storage devices (e.g., hard drives, read only memory (ROM), etc.), network connectivity devices, etc. In other examples, the system 100 may be representative of a network device (e.g., a router, a switch, etc.), telecommunications devices, automotive devices, or any other device in which a load is powered by a multi-phase power supply. In at least some examples, the system 100 includes a multi-phase power supply 105, a load 110, and a CPU 115. In at least some examples, the system 100 does not include the CPU 115 but instead couples to the CPU 115 to perform the self-calibration of the multi-phase power supply 105, as discussed herein. In yet other examples, although illustrated separately in the system 100, the load 110 includes, or is, the CPU 115 (e.g., such as when the system 100 is representative of a server computer, networking equipment, etc. and the CPU 115 is a component of the server computer, networking equipment, etc. and is powered via a coupling to the multi-phase power supply 105).

In at least some examples, the multi-phase power supply 105 includes a controller 120, and a plurality of power stages 125A, 125B, . . . 125N. In some examples, the controller 120 includes a digital logic and memory 130, a loop controller 135, a phase manager 140 (sometimes referred to as phase control logic), a communication interface 145, an analog-to-digital converter (ADC) 150, a sequencer 155, a plurality of amplifiers 160A, 160B, . . . 160N, a gain adjuster 165, and an offset adjuster 170. In at least some examples, the digital logic and memory 130 is coupled to and configured to control the loop controller 135 and the phase manager 140. The digital logic and memory 130 is further coupled to, and configured to receive a signal output by, the ADC 150, which itself is coupled to the sequencer 155 and configured to receive a signal output by the sequencer 155. The sequencer 155 is configured to receive signals from each of the plurality of amplifiers 160A, 160B . . . 160N and provide those signals individually to the ADC 150, for example, by switching an output of the sequencer 155 among the signals received from each of the plurality of amplifiers 160A, 160B, . . . 160N and storing a conversion result for each signals received from each of the plurality of amplifiers 160A, 160B, . . . 160N in a separate location in the digital logic and memory 130. Each of the plurality of amplifiers 160A, 160B, . . . 160N is configured to couple to a respective one of the plurality of power stages 125A, 125B, . . . 125N (sometimes referred to as power phases) to provide measured and/or sensed data to the sequencer from the respective one of the plurality of power stages 125A, 125B, . . . 125N. Additionally, while described as amplifiers, in some examples the plurality of amplifiers 160A, 160B, . . . 160N are representative of an analog processing, filtering, gain adjustment, etc. that may be performed on an analog signal prior to digitization by an ADC (e.g., such that each of the plurality of amplifiers 160A, 160B, . . . 160N may instead be referred to as an analog front end (AFE)). The loop controller 135 is additionally coupled to the phase manager 140 and the phase manager is configured to couple to each of the plurality of power stages 125A, 125B, . . . 125N. In at least some examples, the phase manager 140 is a FPGA or other form of digital or digital-analog hybrid circuitry. The communication interface 145 is configured to couple to the CPU 115 to provide data (e.g., such as telemetry data) to the CPU 115 and/or receive data (e.g., instructions and/or signal values) from the CPU 115. The gain adjuster 165 and the offset adjuster 170, in at least some examples, are not physical or discrete components as illustrated in FIG. 1, but are instead integrated into the digital logic and memory 130. The gain adjuster 165 and the offset adjuster 170 are illustrated in FIG. 1 as separate components for the sake of understanding and ease of description. In at least some examples, the gain adjuster 165 and the offset adjuster 170 are each capable of altering a value of a signal prior to output by the digital logic and memory 130 for provision to the CPU 115 via the communication interface 145. In at least some examples, the gain adjuster 165 and the offset adjuster 170 alter the value of the signal output by the digital logic and memory 130 when the digital logic and memory 130 processes a signal received from the ADC 150 to place the signal in a format understandable, or expected, by the CPU 115.

In at least some examples, the controller 120 and the plurality of power stages 125A, 125B, . . . 125N are implemented together in a circuit (e.g., as chips affixed to a printed circuit board (PCB)) coupled together via interconnects (e.g., such as metal traces incorporated into, on or, the PCB). In at least some examples, additional unshown components (e.g., resistors, inductors, capacitors, etc.) are implemented in the circuit and configured to couple to the controller 120 and/or at least some of the plurality of power stages 125A, 125B, . . . 125N. For example, in at least some implementations inductors are configured to couple in series between an output of each respective power stage of the plurality of power stages 125A, 125B, . . . 125N and the load 110.

In at least one example, the controller 120 is configured to perform self-calibration to optimize performance of the multi-phase power supply 105. The self-calibration, in various examples, adapts for, compensates for, mitigates, and or otherwise makes adjustment to the multi-phase power supply 105 for, one or more errors associated with the multi-phase power supply 105. The errors can include, for example, systematic errors (e.g., predictable errors that may be related to a true value, such as incorrect offset or gain settings), part-to-part errors (e.g., errors specific to particular components, such as resulting from manufacture of the specific component), assembly errors (e.g., errors resulting from and/or related to interconnecting components and/or the interconnects coupling components together), environmental error (e.g., such as resulting from temperature, radiation, etc.), and/or any other error that may be associated with the multi-phase power supply 105 and at least partially capable of being mitigated and/or compensated for by the controller 120.

In at least some examples, the self-calibration includes applying a known, calibrated load to the multi-phase power supply 105 and the controller 120 controlling the plurality of power stages 125A, 125B, . . . 125N to each be individually active at any particular time to determine calibration metrics associated with each respective power stage of the plurality of power stages 125A, 125B, . . . 125N. For example, the controller 120 controls the power stage 125A to be on and the power stages 125B and 125N to be off while one or more measurements of characteristics associated with the power stage 125A are performed. Subsequently, the controller 120 controls the power stage 125B to be on and the power stages 125A and 125N to be off while one or more measurements of characteristics associated with the power stage 125B are performed. The same individual measurement is performed for each of the plurality of power stages 125A, 125B, . . . 125N present in the multi-phase power supply 105. In some examples, the measurements are related to operating temperatures of the plurality of power stages 125A, 125B, . . . 125N, while in other examples the measurements are related to voltage outputs of the plurality of power stages 125A, 125B, . . . 125N and in yet other examples the measurements are related to current outputs of the plurality of power stages 125A, 125B, . . . 125N. In various examples, any number of measurements of characteristics associated with each of the plurality of power stages 125A, 125B, . . . 125N are performed and to obtain any form of data available from each of the plurality of power stages 125A, 125B, . . . 125N.

Figure 2:
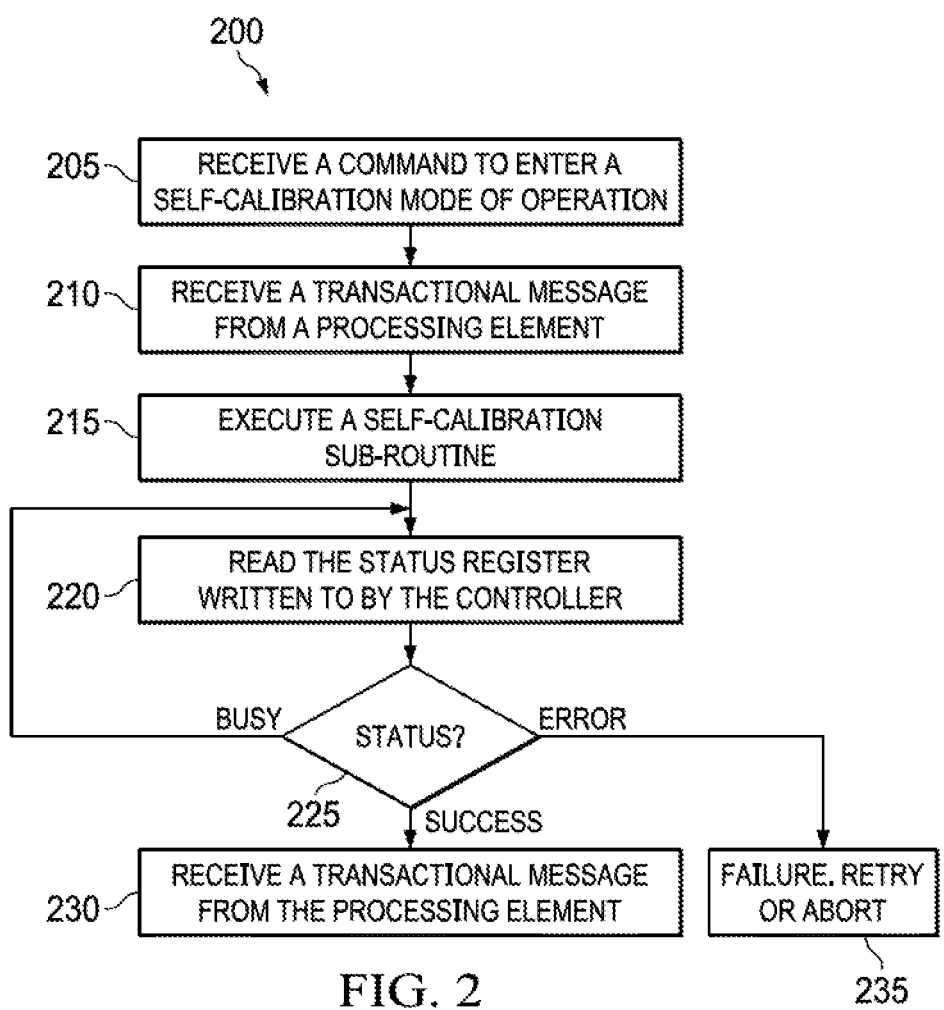
FIG. 2 shows a flowchart of an illustrative method in accordance with various examples.

Turning now to FIG. 2, a flowchart of an illustrative method 200 is shown. In at least some examples, the method 200 is a method for determining a current offset of a power supply, such as the multi-phase power supply 105 of the system 100 of FIG. 1, and is implemented by a controller, such as the controller 120 of the multi-phase power supply 105. In at least some examples the current offset is utilized to calibrate (e.g., self-calibrate) the controller and/or the power supply. As such, in at least some examples the method 200 defines a self-calibration process (or a portion of a self-calibration process) of the controller and/or the power supply.

At operation 205, the controller receives a command to enter a self-calibration mode of operation. The command is received, in some examples, in a transactional message received from a processing element, such as the CPU 115, and is received in some examples as a digital instruction received via a communication interface (e.g., a digital communication interface) such as the communication interface 145. In at least some examples, consecutively or concurrently, a calibrated load is applied to an output of the power supply. In some examples the processing element causes the calibrated load to be applied to the output of the power supply (e.g., through issuance by the processing element of an instruction that causes the calibrated load to be coupled to the output of the power supply), while in other examples the calibrated load is coupled to the output of the power supply without instruction from the processing element. The calibrated load is, in some examples, a load that consumes a known amount of power and/or draws a known amount of current. In at least some examples, the calibrated load can be no load (e.g., an open circuit).

At operation 210, the controller receives a transactional message from the processing element. In at least some examples, the transactional message is a digital message that instructs the controller to begin self-calibration. In at least some examples, the transactional message further indicates and/or conveys to the controller a value of the calibrated load. For example, the processing element provides the value of the calibrated load (e.g., such as an amount of current that the calibrated load is, or will be, configured to draw) to the controller to enable the controller to determine whether an internally measured value is equal to, approximately equal to, or within a tolerance range of the value of the calibrated load.

Figure 3:
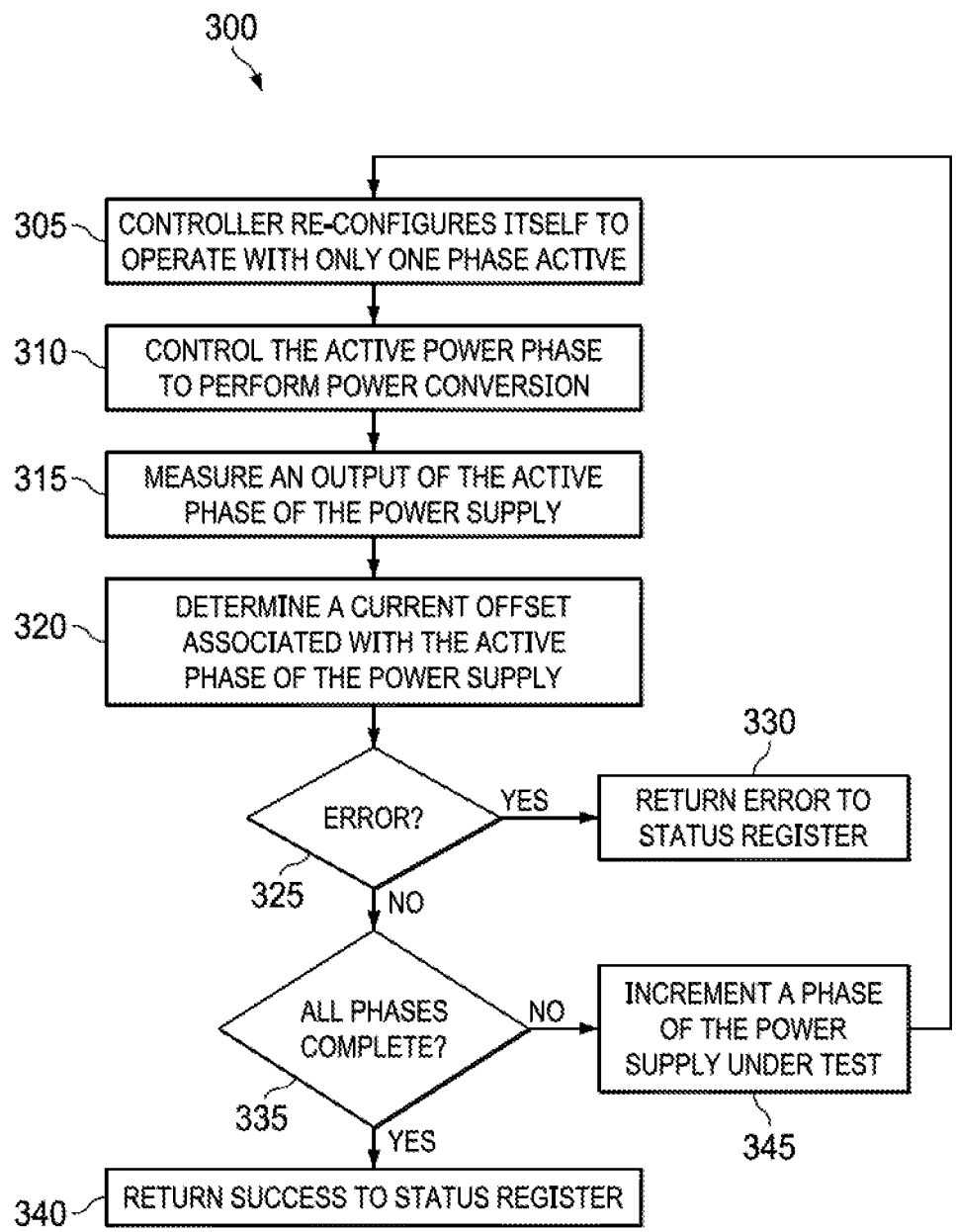
FIG. 3 shows a flowchart of an illustrative method in accordance with various examples.

At operation 215, the controller executes a self-calibration sub-routine. Turning now to FIG. 3, a flowchart of an illustrative method 300 is shown. In at least some examples, the method 300 is a self-calibration sub-routine for determining a current offset of a power supply, such as the multi-phase power supply 105 of the system 100 of FIG. 1, and is implemented by a controller, such as the controller 120 of the multi-phase power supply 105.

At operation 305, the controller reconfigures itself and/or other components of the power supply to operate with only one phase of the power supply, such as one of the plurality of power stages 125A, 125B, . . . 125N, active and to maintain a remainder of phases of the power supply in inactive or turned-off states. In at least some examples, the controller reconfigures itself and/or other components of the power supply to operate with only one phase of the power supply by configuring, reconfiguring, and/or instructing a phase manager, such as the phase manager 140, to use only one active phase to provide power to the calibrated load (e.g., be a sole provider of power to the calibrated load). After beginning processing according to the method 300, but prior to the reconfiguration of the controller or concurrently with the reconfiguration of the controller, the controller writes a value indicating that the method 300 is ongoing (e.g., such as a message reading "BUSY") to a status register accessible by the processing element.

At operation 310, the controller controls the active phase to perform power conversion, providing power to the calibrated load. In at least some examples, during operation 305 the active phase supplies all current drawn by the calibrated load and the inactive phases supply no current to the calibrated load. In this way, the value conveyed to the controller in the transactional message at operation 210 of the method 200 indicates a current draw of the calibrated load and should approximately equal a current value measured and/or calculated by the controller as being provided to the calibrated load by the active phase.

At operation 315, the controller measures an output of the active phase of the power supply. For example, the controller receives an analog signal representative of the output of the active phase of the power supply at a terminal of the controller and converts that analog signal to a digital signal for processing and/or storage by digital structures (e.g., such as digital logic or processing devices) of the controller. In at least some examples, the measurement is a buffered average to reduce, mitigate, and/or compensate for effects of signal noise on the measurement. The buffered average is calculated, in at least some examples, by the digital structures of the controller prior to storage. The analog signal representative of the output of the active phase of the power supply may be provided by the active phase of the power supply and the measurement may be captured and/or performed by the controller in any suitable manner, the scope of which is not limited herein.

At operation 320, the controller determines a current offset associated with the active phase of the power supply. The controller determines the current offset, in some examples, by performing one or more calculations based on the measurement captured at operation 315 and/or the value conveyed to the controller in the transactional message at operation 210. In at least some examples, the controller determines the offset by subtracting one of the measurement captured at operation 315 or the value conveyed to the controller in the transactional message at operation 210 from the other of the measurement captured at operation 315 or the value conveyed to the controller in the transactional message at operation 210. In some examples, after determining the current offset associated with the active phase of the power supply the controller stores the current offset in a memory of the controller and disables power conversion by the active phase of the power supply.

At operation 325, the controller determines whether an error has occurred. In various examples, the error could result from a calibration failure, such as due to a power supply fault, measurement noise causing a calculation result to be outside of expected or allowable limits, a signal not available for calibration, or other various conditions or faults associated with the power supply. When an error has occurred, the controller proceeds to operation 330 and returns a value indicating an error (e.g., such as a message reading "ERROR") to the status register accessible by the processing element, overwriting any value previously present in the status register. When an error has not occurred, the controller proceeds to operation 335.

At operation 335, the controller determines whether a current offset has been determined for each phase of the power supply. When a current offset has been determined for each phase of the power supply the controller proceeds to operation 340 and returns a value indicating success (e.g., such as a message reading "SUCCESS") to the status register accessible by the processing element, overwriting any value previously present in the status register. When a current offset has not been determined for each phase of the power supply, the controller proceeds to operation 345.

At operation 345, the controller increments a phase of the power supply under test by one and returns to operation 305 to perform the method 300 for a next phase of the power supply. In at least some examples, the operation 345 is incorporated into the operation 305 of the method 300, for example, such that the controller determines which phase of the power supply to test and reconfigures itself and/or other components of the power supply to operate with only the phase of the power supply selected for testing being active and all other phases of the power supply being inactive.

Returning to the method 200, at operation 220 the processing element reads the status register written to by the controller at operation 215 (e.g., via operation 330 or operation 340 of the method 300). At operation 225, the processing element determines what a value read by the processing element from the status register indicates. When the status is BUSY (e.g., indicating that the self-calibration sub-routine of method 300 is still ongoing), the method 300 remains at operation 215. When the value is ERROR (or another status written at operation 215 via operation 330 of the method 300), the processing element (and by extension, the controller) exits the self-calibration process, either abandoning the self-calibration process or retrying the self-calibration process by beginning again at operation 205. When the value is SUCCESS (or another status written at operation 215 via operation 340 of the method 300) the method 300 continues to operation 230.

At operation 230, the controller receives a transactional message from the processing element. In at least some examples, the transactional message instructs the controller to update one or more calibration offset values based on the self-calibration process of method 200. In various examples, the transactional message includes calibration offset values for any number phases of the power supply that may be applied by the controller to an output of the power supply when a respective phase of the power supply corresponding to a received calibration offset value is active and contributing to the output of the power supply. In at least some examples, the transactional message further includes an instruction that causes the controller to store, commit, or otherwise preserve at least some of the calibration offset values in a non-volatile memory of the controller (e.g., such as the digital logic and memory 130 of the controller 120 of the system 100 of FIG. 1). In at least some examples, after the controller processes the transactional message received from the processing element at operation 230, the self-calibration process of the method 200 ends and the controller returns from the self-calibration mode to a normal operation mode.

Figure 4:
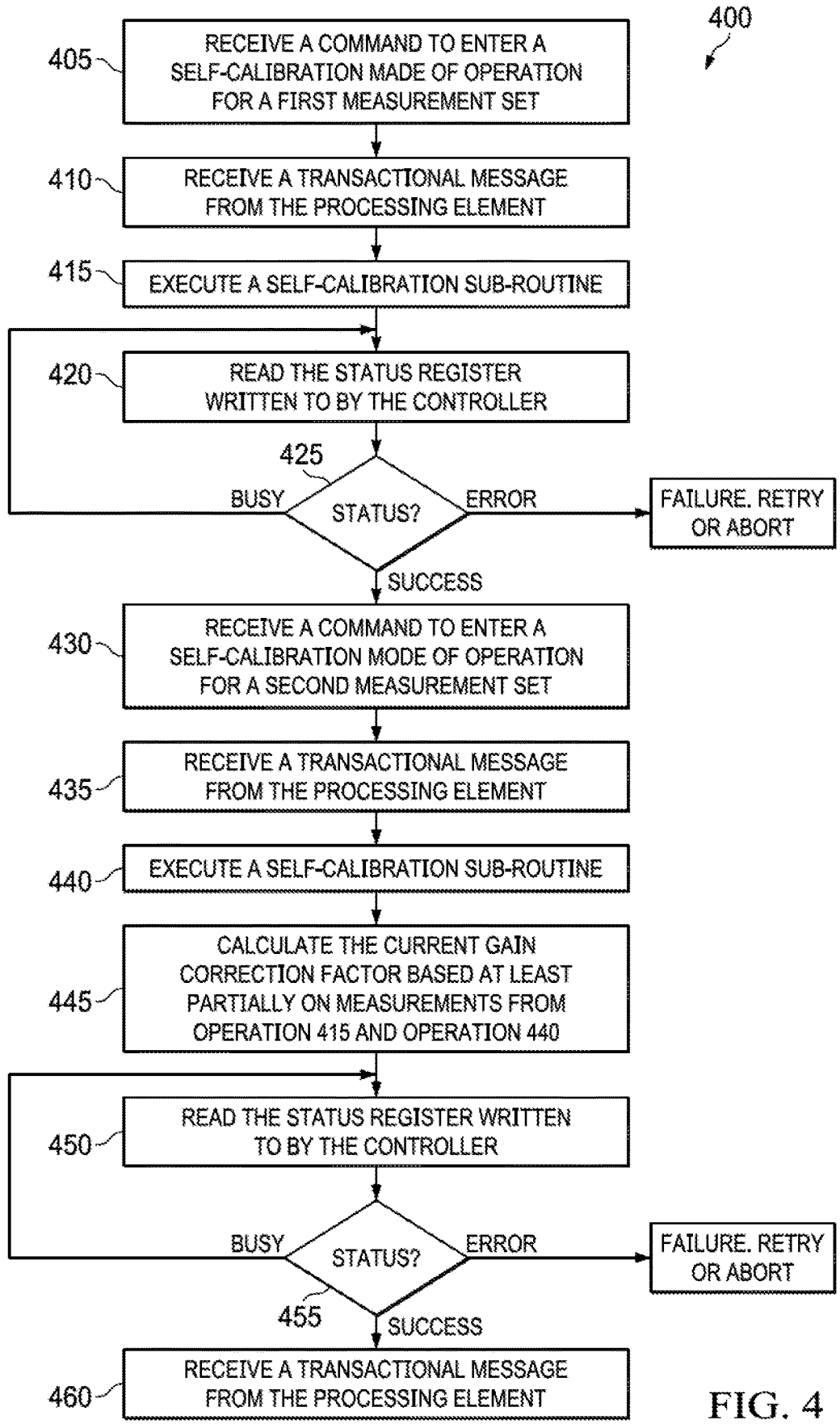
FIG. 4 shows a flowchart of an illustrative method in accordance with various examples.

Turning now to FIG. 4, a flowchart of an illustrative method 400 is shown. In at least some examples, the method 400 is a method for determining a current gain correction factor or gain trim (referred to herein simply as a gain) of a power supply, such as the multi-phase power supply 105 of the system 100 of FIG. 1, and is implemented by a controller, such as the controller 120 of the multi-phase power supply 105. In at least some examples the current gain is utilized to calibrate (e.g., self-calibrate) the controller and/or the power supply. As such, in at least some examples the method 200 defines a self-calibration process (or a portion of a self-calibration process) of the controller and/or the power supply. In at least some examples, the method 400 is complementary to the method 200 such that one or more calculations, determinations, and or data values of the method 200 may also be used by the method 400, or vice versa, and at least some controllers implement one or both of the method 200 and/or the method 400.

At operation 405, the controller receives a command to enter a self-calibration mode of operation for a first measurement set. The command is received, in some examples, in a transactional message received from a processing element, such as the CPU 115, and is received in some examples as a digital instruction received via a communication interface (e.g., a digital communication interface) such as the communication interface 145. In at least some examples, consecutively or concurrently, a first calibrated load is applied to an output of the power supply. In some examples the processing element causes the first calibrated load to be applied to the output of the power supply (e.g., through issuance by the processing element of an instruction that causes the first calibrated load to be coupled to the output of the power supply), while in other examples the first calibrated load is coupled to the output of the power supply without instruction from the processing element. The first calibrated load is, in some examples, a load that consumes a known amount of power and/or draws a known amount of current.

At operation 410, the controller receives a transactional message from the processing element. In at least some examples, the transactional message is a digital message that instructs the controller to begin self-calibration for the first measurement set. In at least some examples, the transactional message further indicates and/or conveys to the controller a value of the first calibrated load. For example, the processing element provides the value of the first calibrated load (e.g., such as an amount of current that the first calibrated load is, or will be, configured to draw) to the controller to enable the controller to determine whether an internally measured value is equal to, approximately equal to, or within a tolerance range of the value of the first calibrated load.

Figure 5:
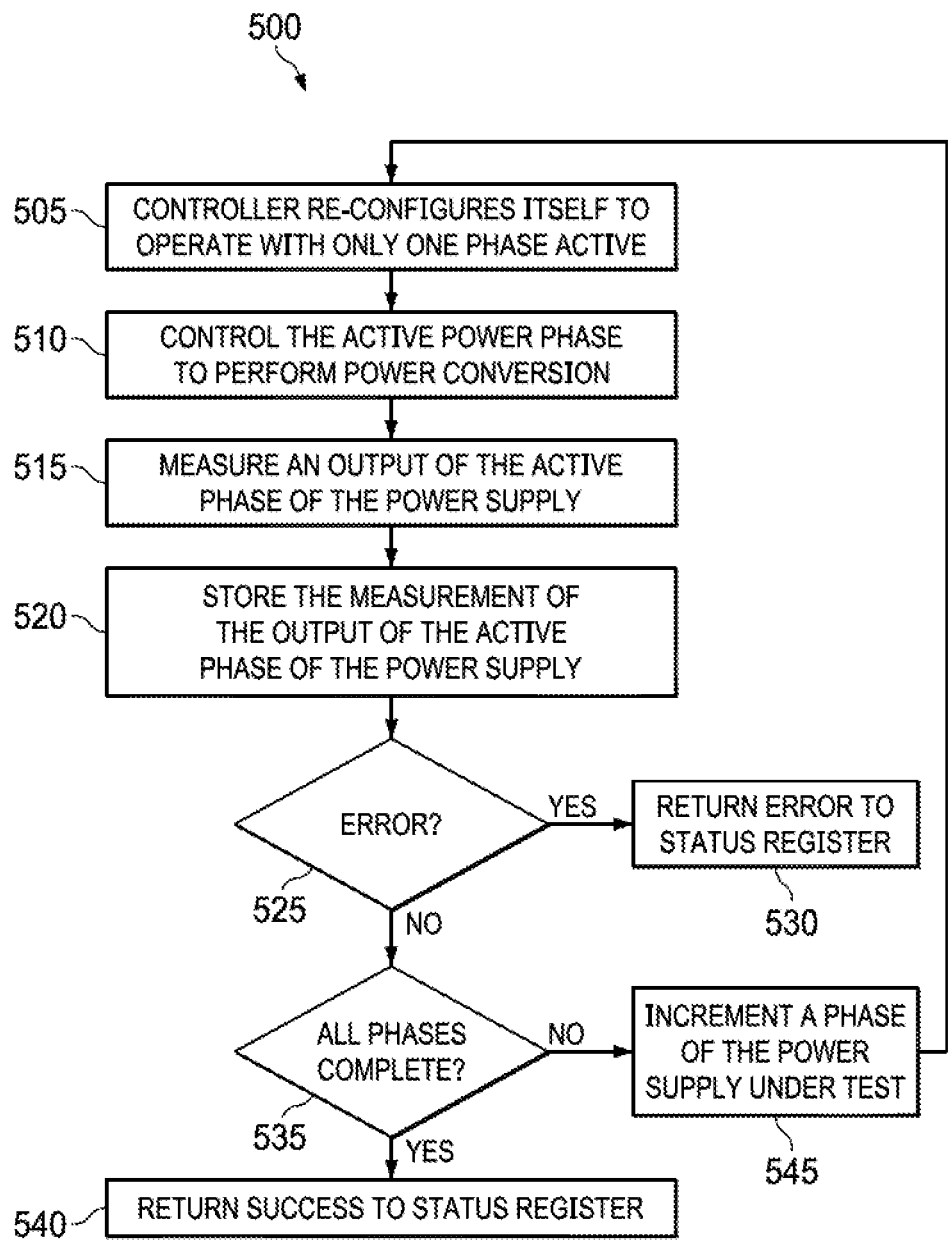
FIG. 5 shows a flowchart of an illustrative method in accordance with various examples.

At operation 415, the controller executes a self-calibration sub-routine. Turning now to FIG. 5, a flowchart of an illustrative method 500 is shown. In at least some examples, the method 500 is a self-calibration sub-routine for use in determining a current gain of a power supply, such as the multi-phase power supply 105 of the system 100 of FIG. 1, and is implemented by a controller, such as the controller 120 of the multi-phase power supply 105. In some examples, the method 300 of FIG. 3 may be implemented as the method 500, omitting the offset determination of operation 320 and, in some examples, instead directly storing the results of the measurement captured at operation 315 in a memory of the controller prior to disabling power conversion by the active phase of the power supply.

At operation 505, the controller reconfigures itself and/or other components of the power supply to operate with only one phase of the power supply, such as one of the plurality of power stages 125A, 125B, . . . 125N, active and to maintain a remainder of phases of the power supply in inactive or turned-off states. In at least some examples, the controller reconfigures itself and/or other components of the power supply to operate with only one phase of the power supply by configuring, reconfiguring, and/or instructing a phase manager, such as the phase manager 140, to use only one active phase to provide power to the first calibrated load (e.g., be a sole provider of power to the calibrated load). After beginning processing according to the method 500, but prior to the reconfiguration of the controller or concurrently with the reconfiguration of the controller, the controller writes a value indicating that the method 500 is ongoing (e.g., such as a message reading "BUSY") to a status register accessible by the processing element.

At operation 510, the controller controls the active phase to perform power conversion, providing power to the first calibrated load. In at least some examples, during operation 505 the active phase supplies all current drawn by the first calibrated load and the inactive phases supply no current to the first calibrated load. In this way, the value conveyed to the controller in the transactional message at operation 410 of the method 400 indicates a current draw of the first calibrated load and should approximately equal a current value measured and/or calculated by the controller as being provided to the first calibrated load by the active phase.

At operation 515, the controller measures an output of the active phase of the power supply. For example, the controller receives an analog signal representative of the output of the active phase of the power supply at a terminal of the controller and converts that analog signal to a digital signal for processing and/or storage by digital structures (e.g., such as digital logic or processing devices) of the controller. In at least some examples, the measurement is a buffered average (e.g., determined by the digital structures of the controller) to reduce, mitigate, and/or compensate for effects of signal noise on the measurement. The analog signal representative of the output of the active phase of the power supply may be provided by the active phase of the power supply and the measurement may be captured and/or performed by the controller in any suitable manner, the scope of which is not limited herein. Subsequently, at operation 520 the controller stores the measurement of the output of the active phase of the power supply in a memory. For example, the controller stores the analog signal representative of the output of the active phase of the power supply in a memory, such as the digital logic and memory 130.

At operation 525, the controller determines whether an error has occurred (e.g., as discussed above with respect to operation 325 of the method 300 of FIG. 3). When an error has occurred, the controller proceeds to operation 530 and returns a value indicating an error (e.g., such as a message reading "ERROR") to the status register accessible by the processing element, overwriting any value previously present in the status register. When an error has not occurred, the controller proceeds to operation 535.

At operation 535, the controller determines whether a measurement has been made for each phase of the power supply. When a measurement has been made for each phase of the power supply the controller proceeds to operation 540 and returns the value indicating success (e.g., such as a message reading "SUCCESS") to a status register accessible by the processing element, overwriting any value previously present in the status register. When a measurement has been made for each phase of the power supply, the controller proceeds to operation 545.

At operation 545, the controller increments a phase of the power supply under test by one and returns to operation 505 to perform the method 500 for a next phase of the power supply. In at least some examples, the operation 545 is incorporated into the operation 505 of the method 500, for example, such that the controller determines which phase of the power supply to test and reconfigures itself and/or other components of the power supply to operate with only the phase of the power supply selected for testing being active and all other phases of the power supply being inactive.

Returning to the method 400, at operation 420 the processing element reads the status register written to by the controller at operation 415 (e.g., via operation 530 or operation 540 of the method 500). At operation 425, the processing element determines what a value read by the processing element from the status register indicates. When the status is BUSY (e.g., indicating that the self-calibration sub-routine of method 500 is still ongoing), the method 400 remains at operation 425. When the value is ERROR (or another status written at operation 415 via operation 530 of the method 500), the processing element (and by extension, the controller) exits the self-calibration process, either abandoning the self-calibration process or retrying the self-calibration process by beginning again at operation 405. When the value is SUCCESS (or another status written at operation 415 via operation 540 of the method 500) the method 400 continues to operation 430.

At operation 430, the controller receives a command to enter the self-calibration mode of operation for a second measurement set. The command is received, in some examples, in a transactional message received from the processing element, as discussed above with respect to operation 405. In at least some examples, consecutively or concurrently, a second calibrated load is applied to the output of the power supply. In some examples the processing element causes the second calibrated load to be applied to the output of the power supply (e.g., through issuance by the processing element of an instruction that causes the second calibrated load to be coupled to the output of the power supply), while in other examples the second calibrated load is coupled to the output of the power supply without instruction from the processing element. The second calibrated load is, in some examples, a load that consumes a known amount of power and/or draws a known amount of current that is different from a known amount of power consumed and/or known amount of current drawn by the first calibrated load, discussed above. In at least some examples, one, but not both, of the first calibrated load or the second calibrated load can be no load (e.g., an open circuit).

At operation 435, the controller receives a transactional message from the processing element. In at least some examples, the transactional message is a digital message that instructs the controller to begin self-calibration for the second measurement set. In at least some examples, the transactional message further indicates and/or conveys to the controller a value of the second calibrated load. For example, the processing element provides the value of the second calibrated load (e.g., such as an amount of current that the second calibrated load is, or will be, configured to draw) to the controller to enable the controller to determine whether an internally measured value is equal to, approximately equal to, or within a tolerance range of the value of the second calibrated load.

At operation 440, the controller executes a self-calibration sub-routine. In at least some examples, execution of the self-calibration subroutine is substantially the same as discussed above with respect to operation 415 and method 500, with reference to the first calibrated load being replaced by reference to the second calibrated load. A description of the method 500 with respect to measuring the second calibrated load to generate the second measurement set is not repeated herein for the sake of brevity. At operation 445, the controller calculates the current gain correction factor based at least partially on the measurements saved at operation 415 and operation 440.

The controller calculates that current gain correction factor, in at least some examples, according to the following equation 1:

$$\text{GAIN}_{NEW} = \text{GAIN}_{OLD} \times \left( \frac{Avg2 - Avg1}{LOAD2 - LOAD1} \right) \quad (1)$$

In the above equation 1 when implemented at operation 445, $\text{GAIN}_{NEW}$ is the current gain correction factor being calculated, $\text{GAIN}_{OLD}$ is a value stored by the controller, Avg2 is an average of the measurements stored at operation 440, Avg1 is an average of the measurements stored at operation 415, LOAD2 is the value of the second calibrated load received at operation 435, and LOAD1 is value of the first calibrated load received at operation 410.

At operation 450 the processing element reads the status register written to by the controller at operation 440 (e.g., via operation 530 or operation 540 of the method 500). At operation 455, the processing element determines what a value read by the processing element from the status register indicates. When the status is BUSY (e.g., indicating that the self-calibration sub-routine of method 500 is still ongoing), the method 400 remains at operation 455. When the value is ERROR (or another status written at operation 440 via operation 530 of the method 500), the processing element (and by extension, the controller) exits the self-calibration process, either abandoning the self-calibration process or retrying the self-calibration process by beginning again at operation 405. In another example, when the value is ERROR (or another status written at operation 440 via operation 530 of the method 500), the controller returns to operation 435, receiving a transactional message from the processing element to cause the controller to begin self-calibration for the second measurement set again while retaining the previously measured and saved first measurement set. When the value is SUCCESS (or another status written at operation 440 via operation 540 of the method 500) the method 400 continues to operation 460.

At operation 460, the controller receives a transactional message from the processing element. In at least some examples, the transactional message instructs the controller to update one or more current gain correction factors based on the self-calibration process of method 400. In various examples, the transactional message includes current gain correction factors for any number phases of the power supply that may be applied by the controller to an output of the power supply when a respective phase of the power supply corresponding to a received current gain correction factor is active and contributing to the output of the power supply. In at least some examples, the transactional message further includes an instruction that causes the controller to store, commit, or otherwise preserve at least some of the current gain correction factors in a non-volatile memory of the controller (e.g., such as the digital logic and memory 130 of the controller 120 of the system 100 of FIG. 1). In at least some examples, after the controller processes the transactional message received from the processing element at operation 430, the self-calibration process of the method 400 ends and the controller returns from the self-calibration mode to a normal operation mode.

In at least some examples, the one or more current gain correction factors determined according to the method 400 are performed under room temperature conditions such that the one or more current gain correction factors are nominal current gain correction factors. In some examples, the nominal current gain correction factors can experience variation, losing accuracy and/or precision, at temperatures higher and/or lower than room temperature. To compensate for the variation, in at least some examples the controller receives one or more temperature compensation factors. The temperature compensation factors are, in at least some examples, a scaling factor to be applied to the nominal current gain correction factors. In at least some examples, the controller further receives one or more temperature threshold values, where each temperature compensation factor corresponds uniquely to a temperature threshold value. In such an example, when the controller determines that a temperature measured by the controller exceeds a temperature threshold value, the controller applies the corresponding temperature compensation factor to the nominal current gain correction factors to mitigate the variation experienced by the nominal current gain correction factors with the change in temperature.

Figure 6:
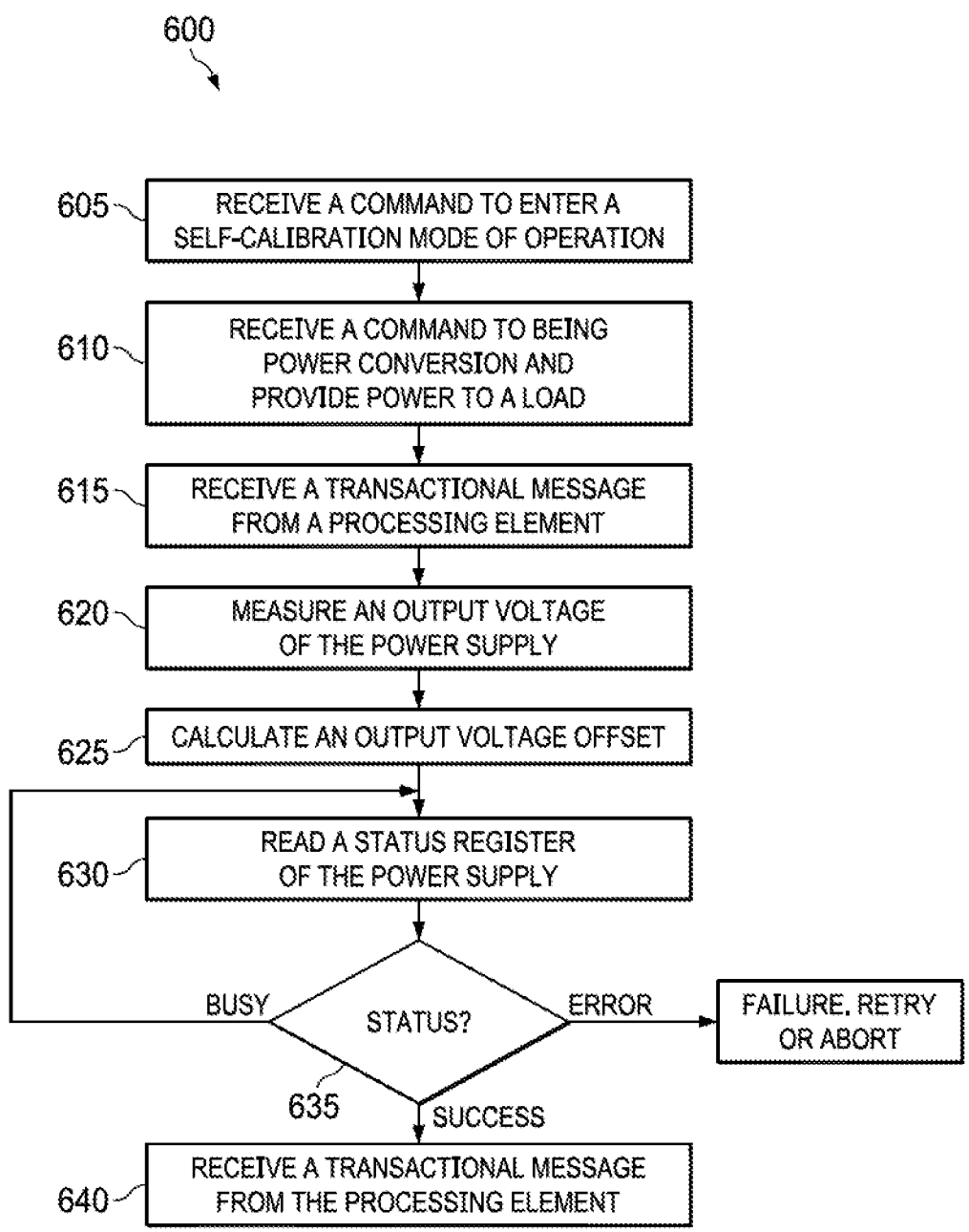
FIG. 6 shows a flowchart of an illustrative method in accordance with various examples.

Turning now to FIG. 6, a flowchart of an illustrative method 600 is shown. In at least some examples, the method 600 is a method for determining an output voltage offset of a power supply, such as the multi-phase power supply 105 of the system 100 of FIG. 1, and is implemented by a controller, such as the controller 120 of the multi-phase power supply 105. In at least some examples the output voltage offset is utilized to calibrate (e.g., self-calibrate) the controller and/or the power supply. As such, in at least some examples the method 600 defines a self-calibration process (or a portion of a self-calibration process) of the controller and/or the power supply.

At operation 605, the controller receives a command to enter a self-calibration mode of operation. The command is received, in some examples, in a transactional message received from a processing element, such as the CPU 115, and is received in some examples as a digital instruction received via a communication interface (e.g., a digital communication interface) such as the communication interface 145. In at least some examples, consecutively or concurrently, a load is applied to an output of the power supply. In various examples, the load is a calibrated load (e.g., as discussed elsewhere herein) or the load is an uncalibrated load.

At operation 610, the controller receives a command to begin power conversion by the power supply (sometimes referred to as power regulation), and provides power to a load responsive to the command. At operation 615, the controller receives a transactional message from the processing element. In at least some examples, the transactional message is a digital message that indicates and/or conveys to the controller a target or ideal output voltage value for the power supply. In at least some examples, operation 605 and operation 610 are performed consecutively, such that a single transactional message both commands the controller to begin power conversion by the power supply and providing the ideal output voltage value for the power supply.

At operation 620, the controller measures an output voltage of the power supply. For example, the controller receives an analog signal representative of an output voltage value of the power supply at a terminal of the controller and converts that analog signal to a digital signal for processing and/or storage by digital structures (e.g., such as digital logic or processing devices) of the controller. The analog signal representative of the output voltage value of the power supply may be provided and the measurement may be captured and/or performed by the controller in any suitable manner, the scope of which is not limited herein.

At operation 625, the controller calculates an output voltage offset at least partially based on the ideal output voltage value received by the controller at operation 615 and the output voltage value of the power supply and subsequently writes a status to a status register of the power supply.

At operation 630 the processing element reads the status register of the power supply. At operation 635, the processing element determines what a value read by the processing element from the status register indicates. When the status is BUSY, the method 600 remains at operation 630. When the value is ERROR, the processing element (and by extension, the controller) exits the self-calibration process, either abandoning the self-calibration process or retrying the self-calibration process by beginning again at operation 605. When the value is SUCCESS, the method 600 continues to operation 640.

At operation 640, the controller receives a transactional message from the processing element. In at least some examples, the transactional message instructs the controller to update one or more output voltage offset values based on the self-calibration process of method 600. In at least some examples, the transactional message further includes an instruction that causes the controller to store, commit, or otherwise preserve at least some of the output voltage offset values in a non-volatile memory of the controller (e.g., such as the digital logic and memory 130 of the controller 120 of the system 100 of FIG. 1). In at least some examples, after the controller processes the transactional message received from the processing element at operation 640, the self-calibration process of the method 600 ends and the controller returns from the self-calibration mode to a normal operation mode.

Figure 7:
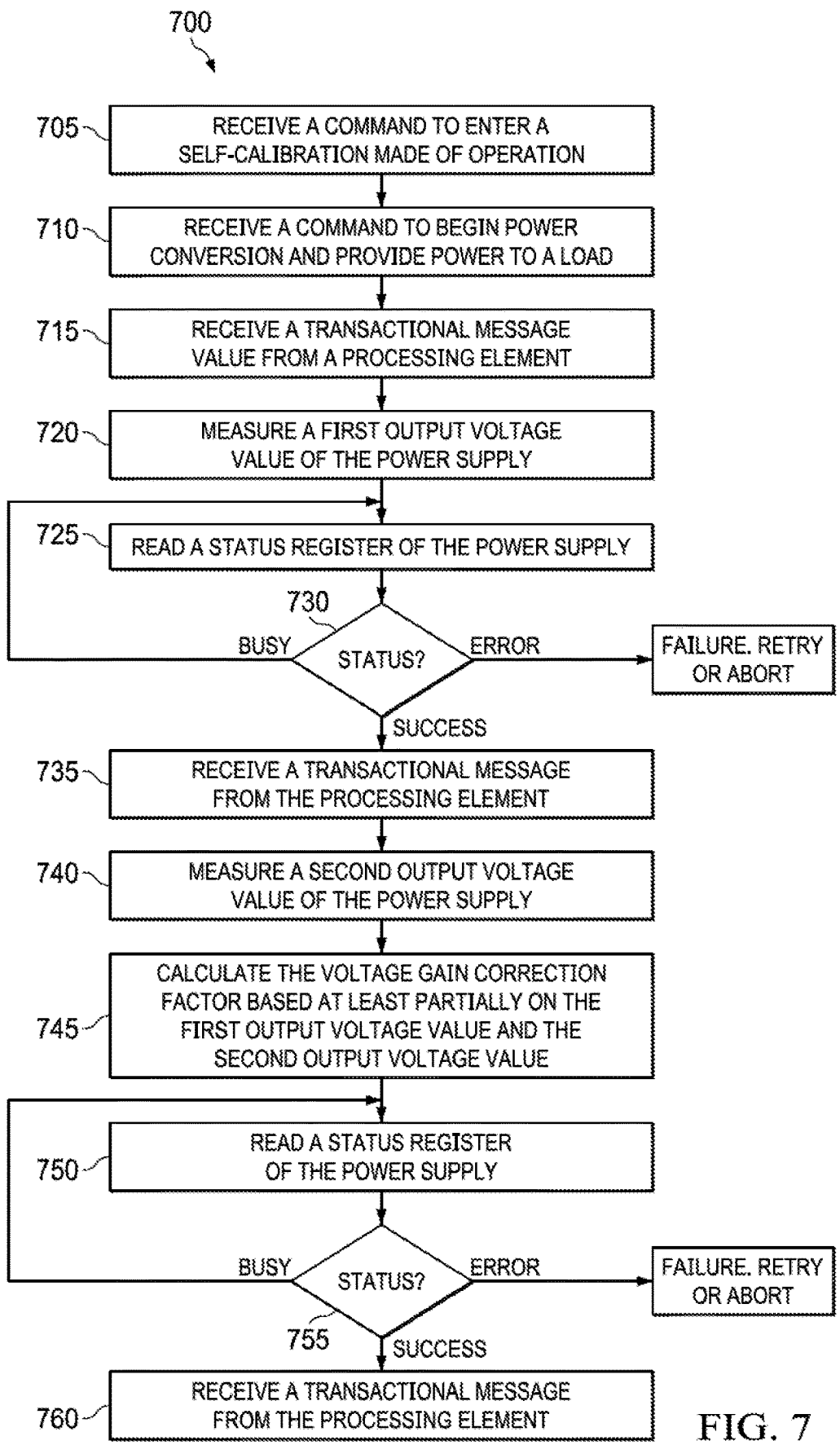
FIG. 7 shows a flowchart of an illustrative method in accordance with various examples.

Turning now to FIG. 7, a flowchart of an illustrative method 700 is shown. In at least some examples, the method 700 is a method for determining a voltage gain correction factor or voltage trim (referred to herein simply as a voltage gain) of a power supply, such as the multi-phase power supply 105 of the system 100 of FIG. 1, and is implemented by a controller, such as the controller 120 of the multi-phase power supply 105. In at least some examples the current gain is utilized to calibrate (e.g., self-calibrate) the controller and/or the power supply. As such, in at least some examples the method 700 defines a self-calibration process (or a portion of a self-calibration process) of the controller and/or the power supply. In at least some examples, the method 700 is complementary to the method 600 such that one or more calculations, determinations, and or data values of the method 600 may also be used by the method 700, or vice versa, and at least some controllers implement one or both of the method 600 and/or the method 700. Further, at least some controllers implement any combination of the various methods disclosed herein in any combination without limitation, for example, such that a single controller can have the functionality of any combination of current and/or voltage offset and/or gain correction factor self-calibration, as discussed by the various methods herein.

At operation 705, the controller receives a command to enter a self-calibration mode of operation. The command is received, in some examples, in a transactional message received from a processing element, such as the CPU 115, and is received in some examples as a digital instruction received via a communication interface (e.g., a digital communication interface) such as the communication interface 145. In at least some examples, consecutively or concurrently, a load is applied to an output of the power supply. In various examples, the load is a calibrated load (e.g., as discussed elsewhere herein) or the load is an uncalibrated load.

At operation 710, the controller receives a command to begin power conversion by the power supply (sometimes referred to as power regulation), and provides power to a load responsive to the command. At operation 715, the controller receives a transactional message from the processing element. In at least some examples, the transactional message is a digital message that indicates and/or conveys to the controller a first target or ideal output voltage value for the power supply. In at least some examples, operation 605 and operation 610 are performed consecutively, such that a single transactional message both commands the controller to begin power conversion by the power supply and provides the first ideal output voltage value for the power supply. Responsive to receiving the transactional message at operation 715, the controller controls the power supply to perform power conversion for an output value approximately equal to the first ideal output voltage value for the power supply.

At operation 720, the controller measures a first output voltage value of the power supply and subsequently writes a status to a status register of the power supply. For example, the controller receives an analog signal representative of an output voltage value of the power supply at a terminal of the controller and converts that analog signal to a digital signal for processing and/or storage by digital structures (e.g., such as digital logic or processing devices) of the controller. The analog signal representative of the output voltage value of the power supply may be provided and the measurement may be captured and/or performed by the controller in any suitable manner, the scope of which is not limited herein. In at least some examples, the controller stores the measurement of the first output voltage value of the power supply in a memory. For example, the controller stores the analog signal representative of the first output voltage value of the power supply in a memory, such as the digital logic and memory 130.

At operation 725 the processing element reads the status register of the power supply. At operation 730, the processing element determines what a value read by the processing element from the status register indicates. When the status is BUSY, the method 700 remains at operation 725. When the value is ERROR, the processing element (and by extension, the controller) exits the self-calibration process, either abandoning the self-calibration process or retrying the self-calibration process by beginning again at operation 705. When the value is SUCCESS, the method 700 continues to operation 735.

At operation 735, the controller receives a transactional message from the processing element. In at least some examples, the transactional message is a digital message that indicates and/or conveys to the controller a second target or ideal output voltage value for the power supply. Responsive to receiving the transactional message at operation 715, the controller controls the power supply to perform power conversion for an output value approximately equal to the second ideal output voltage value for the power supply.

At operation 740, the controller measures a second output voltage of the power supply. For example, the controller receives an analog signal representative of an output voltage value of the power supply at a terminal of the controller and converts that analog signal to a digital signal for processing and/or storage by digital structures (e.g., such as digital logic or processing devices) of the controller. The analog signal representative of the output voltage value of the power supply may be provided and the measurement may be captured and/or performed by the controller in any suitable manner, the scope of which is not limited herein. At operation 745, the controller calculates the voltage gain correction factor based at least partially on the first output voltage value of the power supply and the second output voltage value of the power supply.

The controller calculates that voltage gain correction factor, in at least some examples, according to the above equation 1. When implemented at operation 745, $GAIN_{NEW}$ is the voltage gain correction factor being calculated, $GAIN_{OLD}$ is an old voltage gain value stored by the controller, Avg2 is an average of the measurements stored at operation 740. Avg1 is an average of the measurements stored at operation 720, LOAD2 is the second ideal output voltage value at operation 735, and LOAD1 is the first ideal output voltage value received at operation 715.

At operation 750 the processing element reads a status register of the power supply. At operation 755, the processing element determines what a value read by the processing element from the status register indicates. When the status is BUSY, the method 700 remains at operation 750. When the value is ERROR, the processing element (and by extension, the controller) exits the self-calibration process, either abandoning the self-calibration process or retrying the self-calibration process by beginning again at operation 705. In another example, when the value is ERROR, the controller returns to operation 735, receiving a transactional message from the processing element to cause the controller to begin self-calibration again while retaining the previously measured and saved first ideal output voltage value. When the value is SUCCESS, the method 700 continues to operation 760.

At operation 760, the controller receives a transactional message from the processing element. In at least some examples, the transactional message instructs the controller to update one or more voltage gain correction factor values based on the self-calibration process of method 700. In at least some examples, the transactional message further includes an instruction that causes the controller to store, commit, or otherwise preserve at least some of the voltage gain correction factor values in a non-volatile memory of the controller (e.g., such as the digital logic and memory 130 of the controller 120 of the system 100 of FIG. 1). In at least some examples, after the controller processes the transactional message received from the processing element at operation 760, the self-calibration process of the method 700 ends and the controller returns from the self-calibration mode to a normal operation mode.

In at least some examples, the voltage gain correction factor determined according to the method 700 is determined under room temperature conditions such that the voltage gain correction factor is a nominal voltage gain correction factor. In some examples, the nominal voltage gain correction factor can experience variation, losing accuracy and/or precision, at temperatures higher and/or lower than room temperature. To compensate for the variation, in at least some examples the controller receives one or more temperature compensation factors. The temperature compensation factors are, in at least some examples, a scaling factor to be applied to the nominal voltage gain correction factor. In at least some examples, the controller further receives one or more temperature threshold values, where each temperature compensation factor corresponds uniquely to a temperature threshold value. In such an example, when the controller determines that a temperature measured by the controller exceeds a temperature threshold value, the controller applies the corresponding temperature compensation factor to the nominal voltage gain correction factor to mitigate the variation experienced by the nominal voltage gain correction factor with the change in temperature.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), metal oxide semiconductor FET (MOSFET), n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   phase control logic configured to couple to a plurality of power phases of a multi-phase power supply;
   a first amplifier configured to couple at an input to a first of the plurality of power phases;
   a second amplifier configured to couple at an input to a second of the plurality of power phases;
   an analog-to-digital converter (ADC) configured to couple to the first amplifier and the second amplifier; and
   digital logic configured to couple to the phase control logic and the ADC, wherein the digital logic is configured to:
     receive an instruction to operate in a self-calibration mode of operation;
     receive a first message including a value associated with a calibrated load configured to couple to the plurality of power phases;
     perform a self-calibration sub-routine for each power phase of the plurality of power phases based at least partially on the received instruction, the received first message, and a signal received from the ADC; and
     receive a second message instructing the digital logic to store a result of the self-calibration in a memory of the circuit.

2. The circuit of claim 1, wherein the self-calibration is a current offset determination comprising:
   configuring the circuit to power the calibrated load using only the first power phase of the plurality of power phases;
   controlling the first power phase to perform power conversion and deliver power to the calibrated load;
   receiving, via the ADC, a measurement of a current drawn by the calibrated load;
   determining the current offset of the first of the plurality of power phases based at least partially on the measurement of the current drawn by the calibrated load and the value associated with the calibrated load; and
   storing the current offset of the first of the plurality of power phases in the memory of the circuit.

3. The circuit of claim 1, wherein the self-calibration is a current gain correction factor determination comprising:
   configuring the circuit to power the calibrated load using only the first of the plurality of power phases;
   controlling the first of the plurality of power phases to perform power conversion and deliver power to the calibrated load;

receiving, via the ADC, a measurement of a current drawn by the calibrated load;
storing the measurement of the current drawn by the calibrated load in the memory of the circuit;
receiving a third message including a second value associated with a second calibrated load configured to couple to the plurality of power phases;
configuring the circuit to power the second calibrated load using only the first of the plurality of power phases;
controlling the first power phase to perform power conversion and deliver power to the second calibrated load;
receiving, via the ADC, a measurement of a current drawn by the second calibrated load;
storing the measurement of the current drawn by the second calibrated load in the memory of the circuit;
determining the current gain correction factor of the first of the plurality of power phases based at least partially on the measurement of the current drawn by the calibrated load, the value associated with the calibrated load, the measurement of the current drawn by the second calibrated load, and the second value associated with the second calibrated load; and
storing the current gain correction factor of the first of the plurality of power phases in the memory of the circuit.

4. The circuit of claim 1, wherein the self-calibration is a current gain correction factor determination that determines a nominal current gain correction factor under first temperature conditions, and wherein the digital logic is further configured to receive a temperature correction factor and an associated temperature threshold at which to apply the temperature correction factor to the nominal current gain correction factor.

5. A method, comprising:
receiving, at a circuit, an instruction to operate in a self-calibration mode of operation to calibrate at least some of a plurality of power phases associated with the circuit;
receiving a first message including a value associated with a calibrated load configured to couple to the plurality of power phases;
performing a self-calibration sub-routine for at least some power phases of the plurality of power phases based at least partially on the received instruction and the received first message; and
receiving a second message including an instruction to store a result of the self-calibration in a memory structure.

6. The method of claim 5, wherein the self-calibration is a current offset determination comprising:
configuring the circuit to power the calibrated load using only a first power phase of the plurality of power phases;
controlling the first power phase to perform power conversion and be a sole provider of power to the calibrated load;
receiving a first measurement of a current drawn by the calibrated load; and
determining the current offset of the first power phase based at least partially on the measurement of the current drawn by the calibrated load and the value associated with the calibrated load.

7. The method of claim 6, wherein after determining the current offset of the first power phase, the self-calibration further comprises:
configuring the circuit to power the calibrated load using only a second power phase of the plurality of power phases;
controlling the second power phase to perform power conversion and be a sole provider of power to the calibrated load;
receiving a second measurement of a current drawn by the calibrated load; and
determining a current offset of the second power phase based at least partially on the second measurement of the current drawn by the calibrated load and the value associated with the calibrated load.

8. The method of claim 5, wherein the self-calibration is a current gain correction factor determination comprising:
configuring the circuit to power the calibrated load using only the first of the plurality of power phases;
controlling the first of the plurality of power phases to perform power conversion and deliver power to the calibrated load;
receiving a measurement of a current drawn by the calibrated load;
storing the measurement of the current drawn by the calibrated load in the memory structure;
receiving a third message including a second value associated with a second calibrated load configured to couple to the plurality of power phases;
configuring the circuit to power the second calibrated load using only the first of the plurality of power phases;
controlling the first power phase to perform power conversion and deliver power to the second calibrated load;
receiving a measurement of a current drawn by the second calibrated load; and
determining the current gain correction factor of the first of the plurality of power phases based at least partially on the measurement of the current drawn by the calibrated load, the value associated with the calibrated load, the measurement of the current drawn by the second calibrated load, and the second value associated with the second calibrated load.

9. The method of claim 5, wherein the self-calibration is a current gain correction factor determination that determines a nominal current gain correction factor under first temperature conditions, and wherein digital logic is further configured to receive a temperature correction factor and an associated temperature threshold at which to apply the temperature correction factor to the nominal current gain correction factor under second temperature conditions.

10. The method of claim 5, wherein the self-calibration is a voltage offset determination, comprising:
measuring an output voltage of the circuit; and
determining a voltage offset of the circuit based at least partially on the measurement of the output voltage of the circuit and the value associated with the calibrated load.

11. The method of claim 5, wherein the self-calibration is a voltage gain correction factor determination, comprising:
measuring a first output voltage of the circuit;
storing the measurement of the first output voltage in the memory structure;
receiving a fourth message including a second value associated with a second calibrated load configured to couple to the plurality of power phases;
measuring a second output voltage of the circuit; and
determining the voltage gain correction factor based at least partially on the measurement of the first output voltage, the value associated with the calibrated load, the measurement of the second output voltage, and the second value associated with the second calibrated load.

12. A system, comprising:
a plurality of power phases;
a load coupled to each of the plurality of power phases; and
a controller, configured to:
receive an instruction to operate in a self-calibration mode of operation to calibrate at least some of the plurality of power phases;
receive a first message including a value associated with the load;
perform a self-calibration sub-routine for at least some power phases of the plurality of power phases based at least partially on the received instruction and the received first message; and
receive a second message including an instruction to store a result of the self-calibration in a memory structure.

13. The system of claim 12, wherein the controller, when performing the self-calibration sub-routine, is configured to:
set a first power phase of the plurality of power phases to be active and a remainder of the plurality of power phases to be inactive;
control the first power phase to perform power conversion and be a sole provider of power to the calibrated load;
receive a first measurement of a current drawn by the calibrated load; and
determine a current offset of the first power phase based at least partially on the measurement of the current drawn by the calibrated load and the value associated with the calibrated load.

14. The system of claim 13, wherein the controller is configured to:
set a second power phase of the plurality of power phases to be active and the remainder of the plurality of power phases to be inactive;
control the second power phase to perform power conversion and be a sole provider of power to the calibrated load;
receive a second measurement of a current drawn by the calibrated load; and
determine a current offset of the second power phase based at least partially on the second measurement of the current drawn by the calibrated load and the value associated with the calibrated load.

15. The system of claim 12, wherein the controller, when performing the self-calibration sub-routine, is configured to:
set a first power phase of the plurality of power phases to be active and a remainder of the plurality of power phases to be inactive;
control the first power phase to perform power conversion and deliver power to the calibrated load;
receive a measurement of a current drawn by the calibrated load;
store the measurement of the current drawn by the calibrated load in the memory structure;
receive a third message including a second value associated with a second calibrated load configured to couple to the plurality of power phases;
set the controller to power the second calibrated load using only the first of the plurality of power phases;
control the first power phase to perform power conversion and deliver power to the second calibrated load;
receive a measurement of a current drawn by the second calibrated load; and
determine a current gain correction factor of the first of the plurality of power phases based at least partially on the measurement of the current drawn by the calibrated load, the value associated with the calibrated load, the measurement of the current drawn by the second calibrated load, and the second value associated with the second calibrated load.

16. The system of claim 12, wherein the self-calibration is a current gain correction factor determination that determines a nominal current gain correction factor under first temperature conditions, and wherein the digital logic is further configured to receive a temperature correction factor and an associated temperature threshold at which to apply the temperature correction factor to the nominal current gain correction factor.

17. The system of claim 12, wherein the controller, when performing the self-calibration sub-routine, is configured to:
measure an output voltage of the plurality of power phases; and
determine a voltage offset of the plurality of power phases based at least partially on the measurement of the output voltage of the plurality of power phases and the value associated with the calibrated load.

18. The system of claim 12, wherein the controller, when performing the self-calibration sub-routine, is configured to:
measure a first output voltage of the plurality of power phases;
store the measurement of the first output voltage in the memory structure;
receive a fourth message including a second value associated with a second calibrated load configured to couple to the plurality of power phases;
measure a second output voltage of the plurality of power phases; and
determine a voltage gain correction factor based at least partially on the measurement of the first output voltage, the value associated with the calibrated load, the measurement of the second output voltage, and the second value associated with the second calibrated load.

19. The system of claim 12, wherein the controller is further configured to receive a fifth message instructing the controller to exit the self-calibration mode of operation and operate according to a normal mode of operation, and wherein the controller controls an output of at least some of the plurality of power phases at least partially according to a result of the self-calibration mode of operation.

20. The system of claim 12, wherein the controller is configured to determine at least one of a current offset value, a voltage offset value, a current gain correction factor, or a voltage gain correction factor in the self-calibration mode of operations, and wherein the controller controls an output of at least some of the power phases according to at least one of the current offset value, the voltage offset value, the current gain correction factor, or the voltage gain correction factor when not operating in the self-calibration mode of operation.

* * * * *